United States Patent

Chandra et al.

[11] Patent Number: 5,935,638

[45] Date of Patent: Aug. 10, 1999

[54] SILICON DIOXIDE CONTAINING COATING

[75] Inventors: Grish Chandra; Loren Andrew Haluska, both of Midland, Mich.

[73] Assignee: Dow Corning Corporation, Midland, Mich.

[21] Appl. No.: 09/129,765

[22] Filed: Aug. 6, 1998

[51] Int. Cl.$^6$ ..................................................... B05P 5/12
[52] U.S. Cl. .................. 427/58; 427/226; 427/240; 427/282; 427/430.1; 427/387; 427/420; 427/421; 427/419.7; 428/446
[58] Field of Search .............................. 427/58, 226, 240, 427/282, 430.1, 387, 420, 421; 428/446, 419.7

[56] References Cited

U.S. PATENT DOCUMENTS

| | | | |
|---|---|---|---|
| 4,804,731 | 2/1989 | Hench et al. | 427/397.7 |
| 5,059,448 | 10/1991 | Chandra et al. | 427/53.1 |
| 5,145,723 | 9/1992 | Ballance et al. | 427/397.7 |
| 5,262,201 | 11/1993 | Chandra et al. | 427/376.2 |
| 5,290,354 | 3/1994 | Haluska | 106/479 |
| 5,318,857 | 6/1994 | Haluska | 428/552 |
| 5,336,532 | 8/1994 | Haluska et al. | 427/515 |
| 5,358,739 | 10/1994 | Baney et al. | 427/226 |
| 5,399,441 | 3/1995 | Bearinger et al. | 428/689 |
| 5,481,135 | 1/1996 | Chandra et al. | 257/701 |
| 5,489,408 | 2/1996 | Nakano et al. | 427/181 |
| 5,508,062 | 4/1996 | Haluska et al. | 427/226 |
| 5,686,172 | 11/1997 | Ohya | 427/96 |
| 5,696,217 | 12/1997 | Dismukes et al. | 528/10 |
| 5,710,203 | 1/1998 | Camilletti et al. | 524/435 |
| 5,711,987 | 1/1998 | Bearinger et al. | 427/7 |

FOREIGN PATENT DOCUMENTS 0 590 780 A1  4/1994  European Pat. Off. .

OTHER PUBLICATIONS

McGraw–Hill Dictionary of Scientific and Technical Terms, Third Edition; p. 629, (no date).

The American Society for Testing and Materials; Designation: D 3363–74; Standard Test Method for Film Harness by Pencil Test; pp. 712–713, (no date).

Encyclopedia of Polymer Science and Engineering, 2nd edition, vol. 13, pp. 324–327, 1988.

*Primary Examiner*—Janyce Bell
*Attorney, Agent, or Firm*—Sharon K. Severance; Timothy J. Troy

[57] ABSTRACT

A silicon dioxide containing coating can be used for multilayer hermetic coatings, interlayer dielectric coatings, and flat panel display coatings. The coating is formed by applying a coating composition comprising polysilastyrene to a substrate and heating the polysilastyrene in an oxidizing atmosphere.

13 Claims, No Drawings

5,935,638

SILICON DIOXIDE CONTAINING COATING

FIELD OF THE INVENTION

This invention relates to a silicon dioxide containing coating and a method for its preparation. More particularly, this invention relates to a silicon dioxide containing coating formed from polysilastyrene. The coating can be used on substrates such as electronic devices.

BACKGROUND OF THE INVENTION

Various silicon-containing materials can be used as precursors to silicon dioxide. For example, silsesquioxane resins, silicate esters and hydrolyzed products thereof, polysilazanes, polycarbosilanes, and combinations thereof are known in the art.

Methods of forming silicon dioxide ceramic coatings are known in the art. For example, U.S. Pat. No. 5,336,532 issued to Haluska et al. on Aug. 9, 1994, and U.S. Pat. No. 5,318,857 to Haluska et al. on Jun. 7, 1994, disclose methods of forming silicon dioxide containing ceramics on microelectronic devices. The methods comprise forming a coating of a ceramic precursor on the device and heating the precursor to a temperature of 40 to 400° C. in the presence of ozone. The ceramic precursor in U.S. Pat. No. 5,336,532 comprises hydrogen silsesquioxane resin. The ceramic precursor in U.S. Pat. No. 5,318,857 comprises a hydrolyzed or partially hydrolyzed silicon alkoxide.

U.S. Pat. No. 5,262,201 issued to Chandra et al. on Nov. 16, 1993, discloses a method of making ceramic coatings. The method comprises heating a ceramic precursor to 20 to 500° C. in an atmosphere comprising aqueous ammonia or ammonium hydroxide.

Methods of forming ceramic-like coatings containing silicon dioxide are also known in the art. For example, U.S. Pat. No. 5,290,354 issued to Haluska on Mar. 1, 1994, discloses a method forming a ceramic or ceramic-like coating on a substrate, such as an electronic device, as well as the substrate coated thereby. The method comprises coating the substrate with a solution comprising a solvent, hydrogen silsesquioxane resin and a metal oxide precursor. The solvent is then evaporated, thereby depositing a pre-ceramic coating on the substrate. The pre-ceramic coating is then ceramified by heating to a temperature of 40° C. and 1,000° C. This coating may be covered by additional passivation and barrier coatings.

U.S. Pat. No. 5,145,723 issued to Ballance et al. on Sep. 8, 1992 discloses a method of forming a silica coating on a substrate. The method comprises coating a substrate with a silica precursor having a melting point between 50° C. and 450° C. The coating is heated to a temperature above its melting point in an inert environment to allow the coating to melt and flow. The melted coating is then heated in an environment which facilitates conversion to silica for a time sufficient to convert it to silica.

U.S. Pat. No. 5,399,441 issued to Bearinger, et al. on Mar. 21, 1995 discloses a method of forming opaque coatings on integrated circuits. The method comprises applying a coating of a silica precursor resin and a filler onto the integrated circuit and heating the coated circuit to a temperature of 50 to 1000° C. to form a silica containing ceramic. The silica precursor resin can comprise hydrogensilsesquioxane resin and hydrolyzed or partially hydrolyzed alkoxysilanes, and may be heated in an oxidizing or non-oxidizing atmosphere.

U.S. Pat. No. 5,710,203 issued to Camilletti et al. on Jan. 20, 1998 discloses a method of forming a tamper-proof coating on an electronic device. The method comprises applying a coating of a silica precursor resin and a filler onto the electronic device, wherein the filler is one which reacts in an oxidizing atmosphere to liberate enough heat to damage the electronic device. The coated electronic device is then heated at a temperature sufficient to convert the silica precursor resin to a silica containing ceramic matrix.

U.S. Pat. No. 5,508,062 issued to Frye et al. on Apr. 16, 1996 discloses a method of forming an insoluble coating on a substrate. The method comprises mixing a composition comprising an alkoxysilane and a titanium catalyst to form a coating mixture. The coating mixture is then applied on a substrate and then exposed to atmospheric moisture for a time sufficient to form an insoluble coating. Finally, the substrate having the insoluble coating is heated at a temperature between 100 and 600° C. for up to 6 hours.

U.S. Pat. No. 5,711,987 issued to Bearinger et al. on Jan. 27, 1998 discloses a method of forming a tamper-proof coating on an electronic device by (1) applying on the device a composition comprising pre-ceramic silicon-containing material and filler and thereafter ceramifying the pre-ceramic silicon-containing material and (2) applying over the ceramic layer a sealer layer produced from a colloidal inorganic-based siloxane resin, benzocyclobutene based resin, polyimide resin, siloxane polyimides and parylene and thereafter curing the resin. The coating may further comprise optional third (amorphous SiC:H, diamond, silicon nitride and parylene) and fourth layers (same as second layer).

However, none of these methods disclose polysilastyrene as a precursor to silicon dioxide.

Therefore, it is an object of this invention to provide a method of using polysilastyrene to form a silicon dioxide containing coating on a substrate, such as an electronic device.

It is a further object of this invention to provide a method of forming a multi-layer coating on a substrate, wherein at least one layer is a silicon dioxide containing coating made from a coating composition comprising polysilastyrene.

SUMMARY OF THE INVENTION

This invention relates to a method of forming a silicon dioxide containing coating. The method comprises heating a coating composition comprising polysilastyrene in an oxidizing atmosphere to form the silicon dioxide containing coating. The silicon dioxide containing coating can be used in hermetic coating systems, as an interlayer dielectric coating, or as a planarizing coating. The silicon dioxide containing coating is used on electronic devices.

DETAILED DESCRIPTION OF THE INVENTION

This invention relates to a method of forming a silicon dioxide containing coating on a substrate. "Silicon dioxide containing coating" means amorphous silicon dioxide that may contain residual carbon, silanol, hydrogen, or combinations thereof. The method of forming the silicon dioxide containing coating comprises applying a coating composition comprising polysilastyrene to a substrate and heating the polysilastyrene in an oxidizing atmosphere to form the silicon dioxide containing coating.

Polysilastyrene comprises units with the formulae (($CH_3$)$_2$Si) and ($C_6H_5SiCH_3$). The ratio of silicon-bonded methyl groups to silicon-bonded phenyl groups in the polysilastyrene is typically 1:1 to 4:1.

Polysilastyrene is known in the art and can be prepared by methods known in the art. For example, *Encyclopedia of*

*Polymer Science and Engineering*, 2nd ed., vol. 13, pp. 324–327, 1988, describes a method comprising sodium de-chlorination of dimethyldichlorosilane and methylphenyldichlorosilane. De-chlorination can be carried out by heating the dimethyldichlorosilane and methylphenyldichlorosilane to a temperature greater than 100° C. in the presence of sodium and toluene.

The coating composition further comprises optional ingredients. The optional ingredients include modifying ceramic oxide precursors, fillers, silane coupling agents, catalysts, flux agents, and combinations thereof.

The coating composition may comprise one or more modifying ceramic oxide precursors. "Modifying ceramic oxide precursor" means metal and non-metal compounds having one or more hydrolyzable groups bonded to the metal or non-metal. Examples of suitable metals include aluminum, titanium, zirconium, tantalum, niobium, and vanadium. Examples of suitable non-metals include boron and phosphorous. Examples of hydrolyzable groups include alkoxy, such as methoxy, ethoxy, and propoxy; acyloxy such as acetoxy; and other organic groups bonded to the metal or non-metal through an oxygen atom.

The modifying ceramic oxide precursor must be capable of being dissolved in a solvent, hydrolyzed, and subsequently pyrolyzed. The amount of modifying ceramic oxide precursor used in the coating composition is typically selected such that the silicon dioxide containing coating contains 0.1 to 30 wt % of the modifying ceramic oxide formed from the modifying ceramic oxide precursor.

The coating composition may further comprise at least one filler. "Fillers" are finely divided solids distributed within the silicon dioxide containing coating. Fillers are unreactive with the polysilastyrene in the coating composition. Fillers may be organic or inorganic. Inorganic fillers with a variety of morphologies can be used, including flakes, particles, powders, and microballoons. The filler morphology and particle size depend on the type of filler and desired thickness of the coating. The filler can have a small particle size in the submicrometer range (i.e. 5 to 150 millimicrometers) up to a large particle size such as 100 to 500 micrometers. Suitable fillers include optically opaque, radiopaque, luminescent, oxidation resistant, abrasion resistant, magnetic, and conductive fillers.

Optically opaque fillers are fillers that render the silicon dioxide containing coating impenetrable to visual light. Optically opaque fillers include oxides, nitrides, and carbides of silicon, alumina, metals, and inorganic pigments. Preferred optically opaque fillers include plasma alumina microballoons having an average particle size of about 6 micrometers, silica microballoons having an average particle size of about 5 to 40 micrometers, silicon nitride ($Si_3N_4$) powder or whiskers, silicon carbide powder or whiskers, aluminum nitride powder, and black inorganic pigments such as black FERRO® F6331 having an average particle size of about 0.4 micrometers.

Radiopaque fillers are fillers that render the silicon dioxide containing coating impenetrable to sound waves and radiation such as x-rays, ultraviolet, infrared, and visible light. Radiopaque fillers include heavy metals such as lead and tungsten, and insoluble salts of heavy metals such as barium, lead, silver, gold, cadmium, antimony, tin, palladiun, strontium, and bismuth. The salts can include carbonates, sulfates, and oxides. Tungsten is preferred.

Luminescent fillers are fillers that render the silicon dioxide containing coating capable of absorbing energy and emitting electromagnetic radiation in excess of thermal radiation. Luminescent fillers can be phosphors such as sulfides such as zinc sulfide and cadmium sulfide; selenides; sulfoselenides; oxysulfides; oxygen dominate phosphors such as borates, aluminates, gallates, silicates; and halide phosphors such as alkali metal halides, alkaline earth halides, and oxyhalides. Sulfides are preferred and zinc sulfide is most preferred. Activators may be added to the phosphor compounds. Activators include manganese, silver, and copper; and rare earth ions in the form of halides. The activator is generally present in amounts of 0.1 to 10 mol % based on the weight of the phosphor.

Oxidation resistant fillers are fillers that render the silicon dioxide containing coating resistant to further oxidation by thermal radiation. More specifically, oxidation resistant fillers are fillers that react in an oxidizing environment to liberate excessive localized heat to the underlying substrate, thereby inhibiting further examination of the substrate. Suitable oxidation resistant fillers include metals such as magnesium, iron, silicon, tin, aluminum, and zinc.

Abrasion resistant fillers are fillers that render the silicon dioxide containing coating difficult to remove by frictional means without damaging the substrate. Abrasion resistant fillers are exemplified by diamond, titanium nitride, tungsten carbide, tantalum carbide, and fibers of graphite, KEVLAR®, NEXTEL®, and aluminum oxide.

Energy resistant fillers are fillers that render the silicon dioxide containing coating impenetrable or reactive, or both, to energy sources such as ozone, ultraviolet and ozone, gaseous free radicals and ions, and vapor or liquid borne reactive species and plasmas that could cause damage to the substrate. Energy resistant fillers include heavy metals such as lead, tungsten, tantalum, antimony and others.

Magnetic fillers are fillers that render the silicon dioxide containing coating magnetized by a magnetic field having a net magnetic moment. Magnetic fillers include carbon alloy ferrites, iron carbonyl, and alloys of metals such as iron, manganese, cobalt, nickel, copper, titanium, vanadium, molybdenum, magnesium, aluminum, chromium, zirconium, lead, and zinc. Examples include $Fe_2O_3$, MnZn, NiZn, and CuZn.

Conductive fillers are fillers that render the silicon dioxide containing coating thermally or electrically conductive. Conductive fillers include gold, silver, copper, aluminum, nickel, ZnCr, and cobalt.

Other suitable fillers include secondary fillers such as synthetic and natural materials such as oxides, nitrides, borides, carbides, and sulfides of metals and non-metals such as glass, alumina, silica, titanium dioxide, zinc oxide, tungsten oxide, zirconium oxide, and ruthenium oxide; titanates such as potassium titanate and barium titanate, niobates such as lithium niobate and lead niobate; barium sulfate; calcium carbonate; precipitated diatomite; silicates such as aluminum silicate; pigments and dyes such as crystal violet and cyanines; phosphors; metals such as silver aluminum, copper; calcium silicate such as wollastonite; mica; kaolin; clay; talc; organic materials such as cellulose, polyimides, phenol resins, epoxies, polybenzocyclobutanes; fluorocarbon polymers such as polytetrafluoroethylene, vinylidene fluoride, and hexafluoropropylene; high dielectric constant materials such as titanate, niobate, or tungstate salts of metals such as strontium, zirconium, barium, lead, lanthanium, iron zinc, and magnesium.

The choice of fillers will vary depending on quality and characteristics desired in the silicon dioxide containing coating. The choice of filler also depends on the intended use of the coating.

The amount of filler will vary based on the quality and characteristics desired in the silicon dioxide containing coating and by the ability of the polysilastyrene to bind the filler. Sufficient polysilastyrene must be present to bind the filler. Typically, the amount of filler is 1 to 96 wt %, based on the weight of polysilastyrene. However, smaller amounts of fillers (i.e. 1 to 5 wt % based on the weight of polysilastyrene) are suitable for some applications. Preferably, the amount of filler is 80 to 96 wt % of the coating composition.

The coating composition may further comprise a silane to modify the filler. Generally, suitable silanes have the formula $A_{(4-n)}SiY_n$, where A is a monovalent organic group such as an alkyl, alkenyl, or aryl group, or another functional group such as methacryl, methacryloxy, or epoxy. Y is a hydrolyzable group such as an alkoxy group of 1 to 6 carbon atoms, an alkoxyalkoxy group of 2 to 8 carbon atoms, or an acetoxy group. The subscript 'n' is 1, 2, or 3; preferably 3. Suitable silane coupling agents include 3-methacryloxypropyltrimethoxysilane, 3-glycidoxypropyltrimethoxysilane, 3-mercaptopropyltrimethoxysilane, vinyltriacetoxysilane, vinyltriethoxysilane, vinyl-tris(2-methoxyethoxy)silane, and 2-(3,4-epoxycyclohexyl)ethyltrimethoxysilane. The coating composition can comprise 0.1 to 10 wt % of a silane coupling agent.

The coating composition may further comprise a catalyst to increase the rate and extent of conversion to silicon dioxide. Complexes of platinum, rhodium, and copper that can be solubilized are examples of suitable catalysts. Examples of suitable catalysts include platinum acetylacetonate, $RhCl_3(S(CH_2CH_2CH_2CH_3)_2)_3$, and cupric naphthanate. The catalysts can be added in an amount of 5 to 1,000 ppm of platinum, rhodium, or copper based on the weight of the polysilastyrene.

The coating composition may further comprise a flux agent. "Flux agents" are materials that melt and react with other ingredients in the coating composition resulting in a silicon dioxide containing coating having improved adhesion and toughness. Examples of flux agents include boron oxide and phosphorous pentoxide.

The coating composition can be applied to the substrate in any manner, however, a preferred method comprises producing a solution comprising the coating composition and a solvent, coating the substrate with the solution, and removing the solvent. "Solution" means a solvent containing the coating composition, wherein the polysilastyrene is dissolved and the optional ingredients of the coating composition are dissolved or dispersed, or both, in the solvent.

The solution can be prepared by combining the solvent, polysilastyrene, and optional ingredients by various methods. Stirring and heating may be used to dissolve the polysilastyrene in the solvent. When a filler will be used, the solution can be prepared by mixing the polysilastyrene and optional ingredients with a homogenizer, sonic probe, or colloid mill.

The solvent can be any material that will dissolve the polysilastyrene without altering the silicon dioxide containing coating produced thereby. Suitable solvents include aromatic hydrocarbons such as benzene, toluene and xylene; ketones; esters; and ethers such as tetrahydrofuran and glycol ethers. Typically, the amount of solvent is selected such that the solution contains 20 to 99.1 wt % solvent, preferably 50 to 99 wt % solvent.

The substrate can be coated with the coating composition by any known method, such as spin coating, spraying, flowing, dip coating, drop coating, silk screening, screen printing, stencil printing, meniscus coating, wave solder coating, doctor blade drawdown technique, and others. Spin coating and dip coating are preferred when the coating composition does not contain a filler. Screen printing is preferred for coating compositions that contain fillers. After application of the solution to the substrate, the solvent is removed, leaving a coating comprising polysilastyrene and optional ingredients on the substrate. The solvent can be removed by evaporation under ambient conditions or by applying heat (up to about 50° C.), vacuum, or both. When spin coating is used to apply the solution, the solvent is partially removed during application.

The polysilastyrene is then heated to form the silicon dioxide containing coating on the substrate. Heating is carried out at 50 to 1,000, preferably 50 to 450° C. in an oxidizing atmosphere.

In one method of heating the polysilastyrene at low temperature, the oxidizing atmosphere comprises ozone at a temperature of 50 to 400° C. After heating in the presence of ozone, the silicon dioxide formed may contain residual silanol. Residual silanol can be removed by heating in the presence of aqueous ammonia or ammonium hydroxide, or a combination thereof.

More preferably, heating is carried out at a temperature of 50 to 400° C. in an oxidizing atmosphere comprising air. However, atmospheres containing low levels of oxygen (i.e. on the order of 100 to 500 ppm) to pure oxygen could also be used. As the level of oxygen in the atmosphere increases, the time required for heating decreases. The time required for heating is typically 1 to 3 hours. Heating is complete when FTIR analysis shows that the polysilastyrene has been converted to a silicon dioxide containing coating. "FTIR" means Fourier Transform Infra-Red.

Generally, the silicon dioxide containing coating will be less than 1 to 500 micrometers thick. However, the thickness of the silicon dioxide containing coating depends on the types and amounts of optional ingredients. When the coating does not contain any filler, the coating thickness is typically 50 to 1,000 millimicrometers. When the coating does contain a filler, the coating thickness is typically 0.1 to 500 micrometers, preferably 0.1 to 100 micrometers.

The silicon dioxide containing coating can be used for protecting electronic devices against oxidation, excited energy sources, radiation, light, abrasion, vibration, and acidic materials. Substrates on which the silicon dioxide containing coating can be used are preferably electronic devices. "Electronic devices" include silicon based devices such as silicon wafers, alumina substrates, gallium arsenide based devices, focal plane arrays, optoelectronic devices, photovoltaic cells, optical devices, flat panel displays, and integrated circuits.

The silicon dioxide containing coating of this invention can be used as a planarizing coating, an interlayer dielectric coating, or as a layer in a multi-layer coating system. "Planarizing coating" means a layer of material that has a surface that is less irregular than the surface on which the planarizing coating is applied.

When the silicon dioxide containing coating of this invention will be used as a planarizing coating, the silicon dioxide containing coating is prepared by a method similar to that disclosed in U.S. Pat. No. 5,145,723 issued to Ballance et al. on Sep. 8, 1992, which is hereby incorporated by reference. The method comprises coating a substrate with a coating composition comprising polysilastyrene. The coating composition is heated to a temperature above its melting point to allow the coating composition to melt and flow. The melted coating is then heated in an oxidizing atmosphere at a temperature of 50 to 1,000° C.

When the silicon dioxide containing coating of this invention will be used as an interlayer dielectric coating, the coating composition typically will not contain a filler.

When the silicon dioxide containing coating of this invention will be used as a layer in a multi-layer coating, the multi-layer coating is prepared by applying additional coatings on the substrate either over or under the layer of silicon dioxide containing coating. These additional coatings can be silicon dioxide/ceramic oxide coating, silicon-containing coating, silicon-carbon containing coating, silicon-nitrogen containing coating, silicon-carbon-nitrogen containing coating, silicon-oxygen-nitrogen containing coating, and diamond-like carbon coating. Preferably, the additional coating is selected from the group consisting of silicon-containing coatings, silicon-carbon containing coatings, silicon-nitrogen containing coatings, and silicon-carbon-nitrogen containing coatings.

Various methods can be used to apply the additional coatings. Such methods include chemical vapor deposition (CVD) techniques such as thermal CVD, photochemical vapor deposition, plasma enhanced CVD, electron cyclotron resonance, and jet vapor deposition. Physical vapor deposition (PVD) techniques such as sputtering or electron beam evaporation can also be used. These processes involve either the addition of energy in the form of heat or plasma to a vaporized species to cause the desired reaction; or they focus energy on a solid sample of the material to cause its deposition.

Thermal CVD comprises depositing the coating by passing a stream of a desired precursor gas over a heated substrate, when the precursor gas contacts the hot surface, it reacts and deposits the coating. Substrate temperatures in the range of 25 to 1,000° C. are sufficient to form the coating in several minutes to several hours, depending on the precursor gas and thickness of the coating. Reactive metals can be used in this process to facilitate deposition.

In plasma enhanced CVD, a precursor gas is reacted by passing it through a plasma field. Reactive species are formed and focused at the substrate where they readily adhere. The advantage of this process over a thermal CVD process is that lower substrate and processing temperatures (i.e., 25 to 600° C.) can be used in plasma enhanced CVD.

Precursor gases that can be used in the CVD processes include mixtures of silanes or halosilanes such as trichlorosilane in the presence of tetraethylorthosilicate, alkylsilanes such as trimethylsilane and silacyclobutane.

An optional overcoating that provides additional protection from erosion, delamination, and separation may be applied over the silicon dioxide containing coating. Suitable overcoatings include colloidal inorganic-based siloxane resins, benzocyclobutene based resins, polyimides, siloxane polyimides, parylene, photoresist polymers, siloxane room temperature vulcanizable compositions, and siloxane gels. Colloidal inorganic-based siloxane resins are preferred as the overcoating. The overcoating may be applied by any known method. The overcoating may be applied from a solvent. Suitable methods include flow, spin, spray, and dip coating.

EXAMPLES

These examples are intended to illustrate the invention to those skilled in the art and should not be interpreted as limiting the scope of the invention set forth in the claims.

In the following examples, PSS-400 represents polysilastyrene with a silicon-bonded methyl to phenyl group ratio of 1:1 to 4:1. PSS-120 has a silicon-bonded methyl to phenyl group ratio of 1.13:1. "FTIR" means Fourier Transform Infra-Red.

Example 1

A 5 wt % solution of PSS-400 in heptane was spin coated on a 2.54 sq. cm silicon wafer at 3,000 rpm for 20 seconds. The coated wafer was then heated to 175° C. for 3 hours in an atmosphere, containing 4.1 to 4.4% ozone. FTIR analysis confirmed that the resulting coating contained silicon dioxide and a small amount of silanol.

The coated wafer as then heated to 175° C. for 3 hours in an atmosphere, containing aqueous ammonia vapor. FTIR analysis showed that the silanol had been essentially removed from the coating. The coating thickness was 50 millimicrometers and the refractive index was 1.442.

Example 2

A 30 wt % solution of PSS-400 in toluene was spin coated on a 2.54 sq. cm silicon wafer and a 2.54 sq. cm alumina substrate at 3,000 rpm for 20 seconds. The coated wafer and alumina substrate were heated in a Lindberg Box Furnace™ at 800° C. for 1 hour under an air atmosphere. The coatings on the wafer and substrate were analyzed by FTIR. Each showed complete conversion of the PSS-400 to silicon dioxide. The thickness of the coatings was 0.82 micrometers and the refractive index was 1.439.

Example 3

A coating composition was prepared by mixing the following ingredients with a sonic probe for four 25 second periods:

1.55 g PSS-400, 11.11 g tin (6.97 micrometer), 6.53 g lead (5.0 micrometer), 3.0 g diamond (0–1 micrometer), 3.0 g diamond (4–6 micrometer), 3.0 g diamond (8–12 micrometer), 0.5 g titanium dioxide, and 3.0 g xylene.

The coating composition was applied to a 29 sq. cm alumina panel using a 2 mil draw down bar. The coated panel was allowed to air dry for 2 hours and 15 minutes. The coated panel was then heated at 400° C. for 1 hour in an environment comprising air. The coating formed had no cracks visible at 400× magnification with a microscope. The coating had a pencil hardness of 6H and a thickness of 30.3 micrometers. Pencil hardness is measured according to ASTM D 3363 by placing the coated panel on a firm horizontal surface and pushing a pencil with a known hardness at a 45° angle on the surface away from the operator in a 6.5 mm stroke. The test is started with the hardest pencil and repeated with pencils of decreasing hardness until the pencil will not cut into or gouge the coating. The hardness of the first pencil that will not cut or gouge the coating is reported as pencil hardness of the sample.

We claim:

1. A method of forming a silicon dioxide containing coating comprising:

1) applying a coating composition comprising polysilastyrene and at least one filler to a substrate, 2) heating the coating composition in an oxidizing atmosphere at a temperature of 50 to 1,000° C. to form the silicon dioxide containing coating.

2. The method of claim 1, where the polysilastyrene has methyl and phenyl groups bonded to silicon atoms and the methyl and phenyl groups are present at a ratio of 1:1 to 4:1.

3. The method of claim 1, where the substrate is an electronic device.

4. The method of claim 1, where the filler is selected from the group consisting of optically opaque, radiopaque, luminescent, oxidation resistant, abrasion resistant, energy resistant, magnetic, and conductive fillers.

5. The method of claim 1, wherein the fillers are selected from the group consisting of tin, lead, diamond, titanium dioxide, and combinations thereof.

6. The method of claim 1, where the coating composition further comprises an ingredient selected from the group consisting of modifying ceramic oxide precursors, silane coupling agents, catalysts, flux agents, and combinations thereof.

7. The method of claim 1, where a solution comprising the coating composition and a solvent is used to apply the coating composition to the substrate.

8. The method of claim 7, where the solution is applied to the substrate by a method selected from the group consisting of spin coating, spraying, flowing, dip coating, drop coating, silk screening, screen printing, stencil printing, meniscus coating, wave solder coating, and doctor blade drawdown technique.

9. The method of claim 1, where heating is carried out at a temperature of 50 to 450° C.

10. The method of claim 1, further comprising forming at least one additional coating on the substrate, where the additional coating is selected from the group consisting of silicon-containing coatings, silicon-carbon containing coatings, silicon-nitrogen containing coatings, and silicon-carbon-nitrogen containing coatings.

11. A method of forming a planarizing coating comprising:
   i) applying to a substrate, a coating composition comprising polysilastyrene, where the polysilastyrene has a melting point;
   ii) heating the coating composition in an inert atmosphere to a temperature greater than the melting point of the polysilastyrene to allow the polysilastyrene to melt and flow, and
   iii) heating the coating composition in an oxidizing atmosphere at a temperature of 50 to 1,000° C. to form the planarizing coating.

12. The method of claim 11, where the substrate is a flat panel display.

13. An electronic device produced by:
   1) applying a coating composition comprising polysilastyrene and at least one filler to the electronic device,
   2) heating the coating composition in an oxidizing atmosphere at a temperature of 50 to 1,000° C. to form a silicon dioxide containing coating on the electronic device.

* * * * *